United States Patent
Chamberlin et al.

(10) Patent No.: US 10,149,388 B2
(45) Date of Patent: Dec. 4, 2018

(54) METHOD FOR EMBEDDING A DISCRETE ELECTRICAL DEVICE IN A PRINTED CIRCUIT BOARD

(71) Applicant: INTERNATIONAL BUSINESS MACHINES CORPORATION, Armonk, NY (US)

(72) Inventors: Bruce J. Chamberlin, Vestal, NY (US); Andreas Huber, Boeblingen (DE); Harald Huels, Boeblingen (DE); Thomas Strach, Boeblingen (DE); Thomas-Michael Winkel, Boeblingen (DE)

(73) Assignee: INTERNATIONAL BUSINESS MACHINES, CORPORATION, Armonk, NY (US)

( * ) Notice: Subject to any disclaimer, the term of this patent is extended or adjusted under 35 U.S.C. 154(b) by 198 days.

(21) Appl. No.: 15/175,378

(22) Filed: Jun. 7, 2016

(65) Prior Publication Data
US 2017/0118844 A1 Apr. 27, 2017

Related U.S. Application Data

(63) Continuation of application No. 14/918,678, filed on Oct. 21, 2015, now Pat. No. 9,839,131.

(51) Int. Cl.
*H05K 1/18* (2006.01)
*H05K 3/34* (2006.01)
(Continued)

(52) U.S. Cl.
CPC ........... *H05K 1/184* (2013.01); *B23K 1/0016* (2013.01); *H05K 1/0298* (2013.01); *H05K 1/092* (2013.01);
(Continued)

(58) Field of Classification Search
CPC ........... B23K 1/0016; F16H 2200/0078; F16H 2003/442; F16H 2200/0034;
(Continued)

(56) References Cited

U.S. PATENT DOCUMENTS 4,800,459 A 1/1989 Takagi et al.
6,153,290 A * 11/2000 Sunahara ............ H01L 21/4857
156/89.16

(Continued)

OTHER PUBLICATIONS

Chamberlin et al., Office Action for U.S. Appl. No. 14/918,678, filed Oct. 27, 2015, dated Mar. 28, 2017 (16 pages).
(Continued)

*Primary Examiner* — Minh Trinh
(74) *Attorney, Agent, or Firm* — Margaret McNamara, Esq.; Kevin P. Radigan, Esq.; Heslin Rothenberg Farley & Mesiti, P.C.

(57) ABSTRACT

A method for embedding a discrete electrical device in a printed circuit board (PCB) is provided, which includes: providing a vertical via as a blind hole from a horizontal surface of the PCB to a conductive structure in a first layer, the first layer being one layer of a first core section of a plurality of core sections vertically arranged above each other, each core section including lower and upper conductive layers, and a non-conductive layer in between; inserting the electrical device into the via, with the device extending within at least two of the core sections; establishing a first electrical connection between a first device contact and the conductive structure in the first layer; and establishing a second electrical connection between a second device contact and a second layer, the second layer being one of the conductive layers of a second horizontal core section.

19 Claims, 12 Drawing Sheets

(51) Int. Cl.
| | |
|---|---|
| *H05K 3/00* | (2006.01) |
| *B23K 1/00* | (2006.01) |
| *H05K 1/02* | (2006.01) |
| *H05K 1/09* | (2006.01) |
| *H05K 1/11* | (2006.01) |
| *H05K 3/46* | (2006.01) |
| *H05K 1/16* | (2006.01) |
| *H05K 3/42* | (2006.01) |

(52) U.S. Cl.
CPC ............ *H05K 1/111* (2013.01); *H05K 1/185* (2013.01); *H05K 1/186* (2013.01); *H05K 3/0047* (2013.01); *H05K 3/3447* (2013.01); *H05K 3/4644* (2013.01); *H05K 1/113* (2013.01); *H05K 1/116* (2013.01); *H05K 1/162* (2013.01); *H05K 1/165* (2013.01); *H05K 1/167* (2013.01); *H05K 3/429* (2013.01); *H05K 3/46* (2013.01); *H05K 3/4697* (2013.01); *H05K 2201/093* (2013.01); *H05K 2201/096* (2013.01); *H05K 2201/09309* (2013.01); *H05K 2201/09327* (2013.01); *H05K 2201/09345* (2013.01); *H05K 2201/09381* (2013.01); *H05K 2201/09518* (2013.01); *H05K 2201/09545* (2013.01); *H05K 2201/09845* (2013.01); *H05K 2201/10* (2013.01); *H05K 2201/1003* (2013.01); *H05K 2201/1006* (2013.01); *H05K 2201/10015* (2013.01); *H05K 2201/10022* (2013.01); *H05K 2201/10174* (2013.01)

(58) Field of Classification Search
CPC ..... F16H 2200/0052; F16H 2200/2007; F16H 2200/2012
See application file for complete search history.

(56) References Cited

U.S. PATENT DOCUMENTS

| | | | | |
|---|---|---|---|---|
| 6,486,529 | B2* | 11/2002 | Chi | H01L 23/5223 |
| | | | | 257/306 |
| 6,844,505 | B1* | 1/2005 | Fan | H05K 1/185 |
| | | | | 174/260 |
| 6,928,726 | B2* | 8/2005 | Zollo | H05K 1/185 |
| | | | | 174/260 |
| 6,963,493 | B2 | 11/2005 | Galvagni | |
| 7,286,366 | B2 | 10/2007 | Zollo et al. | |
| 8,284,562 | B2 | 10/2012 | Lee et al. | |
| 8,314,343 | B2* | 11/2012 | Inoue | H05K 1/185 |
| | | | | 174/255 |
| 8,339,798 | B2 | 12/2012 | Minoo et al. | |
| 8,763,240 | B2 | 7/2014 | Bendix et al. | |
| 9,807,885 | B2* | 10/2017 | Sakai | H05K 1/185 |
| 9,839,131 | B2* | 12/2017 | Chamberlin | H05K 1/184 |
| 2002/0033378 | A1 | 3/2002 | Hayashi et al. | |
| 2005/0098346 | A1* | 5/2005 | Fan | H05K 1/185 |
| | | | | 174/260 |
| 2010/0112826 | A1 | 5/2010 | Frasco et al. | |
| 2011/0019376 | A1 | 1/2011 | Hardin et al. | |
| 2011/0116246 | A1 | 5/2011 | Lee et al. | |
| 2015/0124416 | A1 | 5/2015 | Lin | |
| 2017/0118844 | A1* | 4/2017 | Chamberlin | H05K 3/3447 |

OTHER PUBLICATIONS

Braun et al., "3D Stacking Approaches for Mold Embedded Packages", 18th European Microelectronics & Packaging Conference (EMPC), Sep. 12-15, 2011 (8 pages).

Chamberlin et al., "Embedding a Discrete Electrical Device in a Printed Circuit Board", U.S. Appl. No. 14/918,678, filed Oct. 21, 2015 (49 pages).

Chamberlin et al., List of IBM Patents and Patent Applications Treated as Related for U.S. Appl. No. 15/175,378, filed Jun. 7, 2016 (2 pages).

* cited by examiner

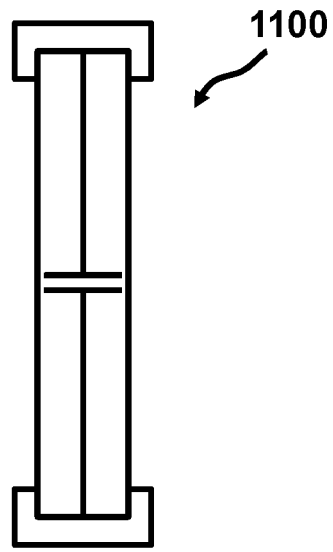
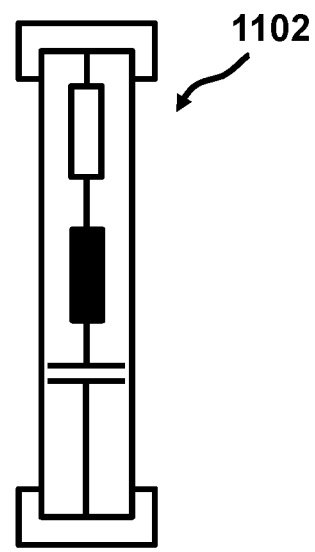
Fig. 11A
Fig. 11B
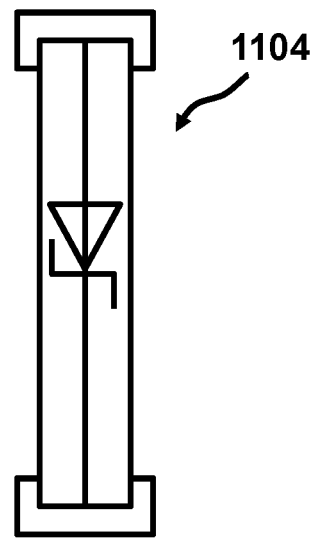
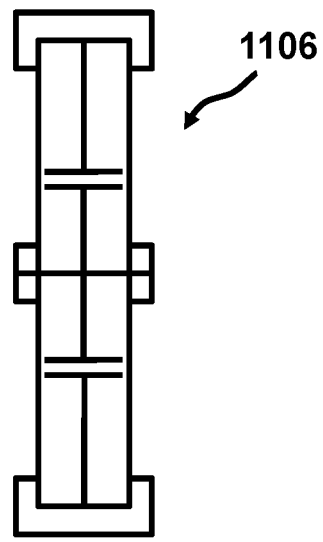
Fig. 11C
Fig. 11D

METHOD FOR EMBEDDING A DISCRETE ELECTRICAL DEVICE IN A PRINTED CIRCUIT BOARD

BACKGROUND

The present disclosure describes a method for embedding a discrete electrical device in a printed circuit board. The disclosure further describes a printed circuit board with a discrete electrical device embedded therein.

In the field of microelectronics, one of the challenges of modern microelectronic system development is the requirement to reduce the dimensions of the systems in order to provide smaller systems and, at the same time, maintain or even improve the performance of the systems. In order to meet this challenge, there is a growing interest to use embedded electrical devices.

The patent publication U.S. Pat. No. 6,928,726 B2 for example describes a component embedded in a typical single chip module (SCM) design. The embedded component is placed in a via of a pre-processed substrate. The thickness of the substrate corresponds to the length of the embedded component. In order to build the respective single chip module with an embedded component, a special manufacturing process is required placing the embedded component in the substrate during manufacturing of the single chip module, wherein a pre-processed substrate is placed on a first adhesive layer, wherein the pre-processed substrate includes at least a via, the embedded component is placed in the via and a second adhesive layer is placed on at least portions of the pre-processed substrate and above at least portions of the embedded component.

SUMMARY

In one or more aspects, a method for embedding a discrete electrical device in a printed circuit board is provided herein. The method includes: providing a vertical via in form of a blind hole from a horizontal surface of the printed circuit board to an electrically conductive structure in a first layer, the first layer being one layer of a first horizontal core section of a plurality of horizontal core sections vertically arranged above each other, each core section comprising a lower and an upper horizontal and electrically conductive layer, and each core section further comprising a horizontal electrically non-conductive core layer arranged between the lower and upper electrically conductive layers; inserting the discrete electrical device into the via, the discrete electrical device extending from the electrically conductive structure in the first layer along the axis of the vertical via within at least two of the horizontal core sections; establishing a first electrical connection between a first electrical contact of the discrete electrical device and the electrically conductive structure in the first layer; and establishing a second electrical connection between a second electrical contact of the discrete electrical device and a second layer, the second layer being one of the electrically conductive layers of the second horizontal core section of the plurality of the horizontal core sections.

BRIEF DESCRIPTION OF THE DRAWINGS

One or more embodiments of the invention are explained in detail below, by way of example only, with reference to the drawings, in which:

FIG. 11A to 11D depict schematics of cross-sections through exemplary discrete electrical devices to be embedded in PCBs, in accordance with one or more aspects of the present invention.

DETAILED DESCRIPTION

Figure 1:
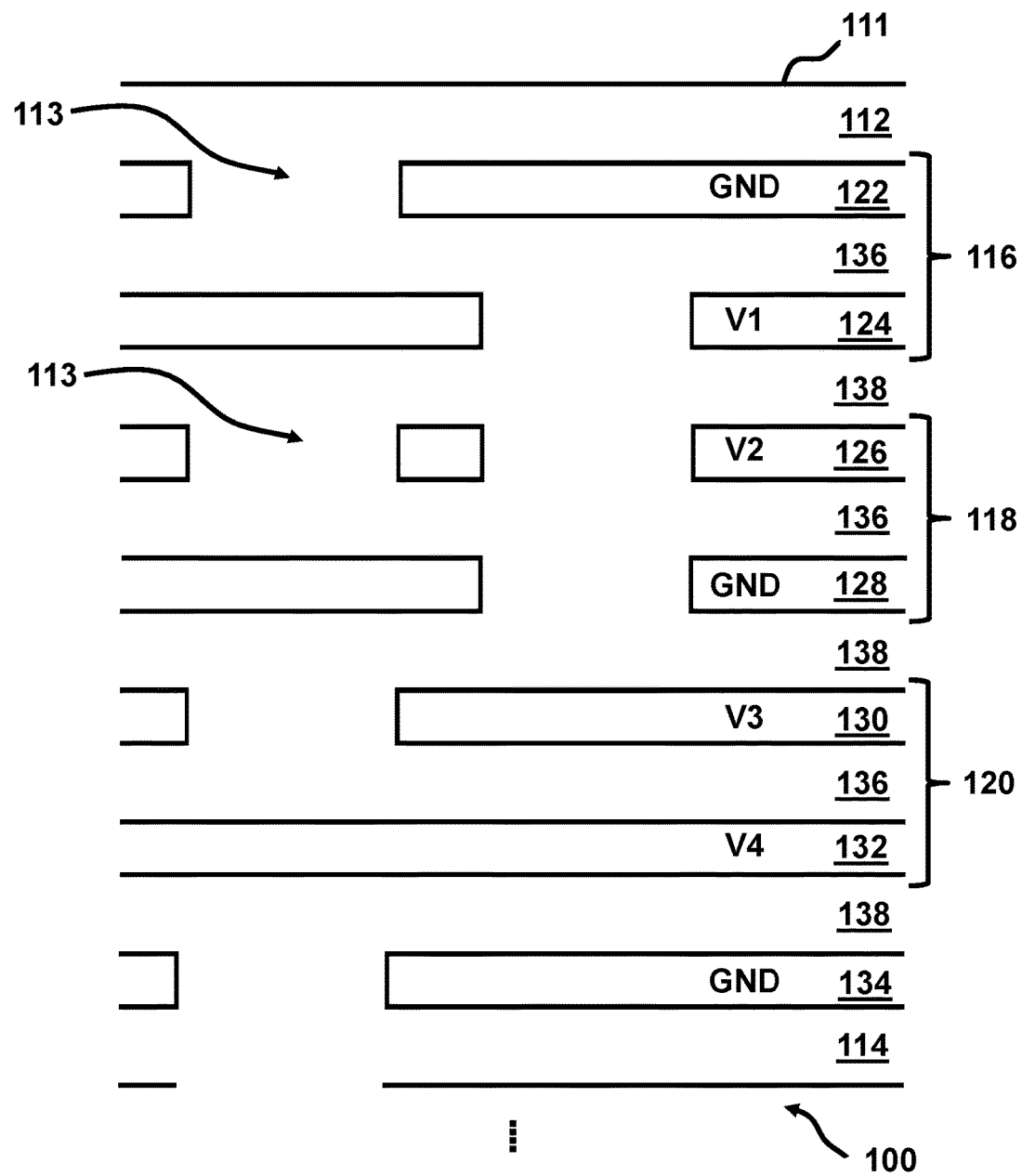
FIG. 1 depicts a schematic of a partial cross-section through a first exemplary printed circuit board (PCB) prior to embedding one or more of discrete electrical devices, in accordance with one or more aspects of the present invention.

A printed circuit board (PCB) according to the present invention may comprise a horizontal top surface and a horizontal bottom surface, a plurality of horizontal core sections vertically arranged above each other between the top and bottom surface, each core section comprising a lower and an upper horizontal electrically conductive layer, each core section further comprising a horizontal electrically non-conductive core layer arranged between the lower and the upper electrically conductive layer.

A printed circuit board mechanically supports and electrically connects electrical devices using conductive tracks, pads and other features, for example, etched from copper sheets laminated onto an electrically non-conductive substrate. In the following, when referring to a PCB, the PCB is referring to a multi-layer PCB which allows for higher component density compared to single sided or double sided structures with only one, or respectively only two, electrically conductive layers.

Manufacturing and assembly of such PCBs is automated. Manufacturing circuits with PCBs may have the advantage that it is cheaper and faster than with other wiring methods as components are mounted and wired with one single part. Furthermore, operator wiring errors may be avoided.

A via according to the present invention is a hole provided in a PCB, e.g. by drilling, that goes from an outer layer, i.e. the horizontal top or bottom surface, vertically through the planes of one or more adjacent layers and which is intended for embedding an discrete electrical device therein. A via in form of a blind hole, i.e. a blind via, connects an electrically conductive structure in an internal layer to an surface of the PCB, thus providing an external access to the electrically conductive structure in the internal layer. The electrically conductive structure may, for example, be provided by an electrically conductive layer of the PCB, i.e., the internal layer may be an electrically conductive layer, or by an electrically conductive structure, like a plated through hole, vertically extending through the internal layer, the internal layer being a non-conductive layer. A non-conductive layer comprises no electrically conductive structures extending horizontally in layer providing a horizontal electrically conductive connection within the layer.

The vertical via may, for example, be provided by drilling. For drilling vias into a PCB, for example, small-diameter drill bits made of solid coated tungsten carbide may be used. Coated tungsten carbide may be advantageous for abrasive board materials and allow use of high RPMs and high feed drilling in order to improve cost effectiveness. Coated tungsten carbide drill bits may further remain sharp so as not to accidentally mar or tear conductive layers or conductive traces, i.e. paths, within conductive layers. The drilling may be performed by automated drilling machines, i.e. computer controlled machines, with placement controlled by a drill tape or drill file. These computer-generated files are also called numerically controlled drill (NCD) and may e.g. be formatted in the IPC-NC-349 format or the Excellon format which is a variant of the EIA RS-274-C standard. The drill file describes the location and size of each drilled hole. Alternatively, for example laser drilling may be used for drilling vias.

PCBs may further comprise plated-through holes (PTH) electrically conductive connected with one or more electrically conductive layers of the PCB. Plated-through holes are holes running through a PCB which are made conductive, e.g. by electroplating or inserting a tube or a rivet, to electrically and thermally connect board layers. Thus, PTHs provide electrical connections to one or more electrically conductive layers of the PCB.

In printed circuit board design, a plated-through hole may comprise two pads in corresponding positions on opposing surfaces of the board, that are electrically connected by the plated-through hole through the board. Thus, a plated-through hole may comprise a barrel, i.e. a conductive tube filling the hole, and a pad at each end of the barrel for establishing electrically conductive connections to electrical devices placed on the PCB which are connected with the pads.

Embodiments of the present invention may have the advantage that they allow for embedding electrical devices in a printed circuit board stack-up without changing the board building process. Printed circuit board with electrical devices according to the present invention may for example be used in mainframes, servers, workstations or PC's as well as other complex electronic devices.

Embedded electrical devices that are functionally integrated in the printed circuit board design are of growing interest for microelectronic system development. From the prior art, like the one disclosed in U.S. Pat. No. 6,928,726 B2, solutions are known wherein an electrical device is vertically inserted in a core layer of a single chip module with contact to a top and a bottom copper layer. However, these solutions are not useful for standard printed circuit board technologies. Applied to a multi-layer printed circuit board, the printed circuit board thickness may increase significantly and exceed the maximal allowed board thickness of complex boards. This is caused by the fact that in these approaches the thickness of the layer comprising the electrical device corresponds to the length of the electrical device, i.e. requiring a certain minimum thickness of the layer correlated with the length of the embedded device.

Besides an unfavorable increase of overall thickness due to thick core layers allowing for embedding long electrical devices, known approaches may further lead to an unfavorable unbalanced stack-up which is asymmetric to the central plane of the board. An unbalanced stack-up may occur if an odd number of core sections is fabricated with embedded electrical devices or if core sections with embedded electrical devices are just placed on the top or bottom side of a printed circuit board. Furthermore, inserting electrical devices in layers according to these approaches during manufacturing requires a change of the standard process flow for generating single chip modules or printed circuit boards.

The standard manufacturing steps of a printed circuit board may comprise: build up and processing of different core sections, comprising, for example, edging, applying adhesive, copper surface treating, etc.; placing electrically non-conductive fill material between adjacent core sections; laminating; drilling of plated through holes and copper plating the inner surfaces of the same; etching out layers; surface finishing; applying a silk screen.

Summarizing, known prior art solutions using buried vias to place electrical devices in a core layer have the major disadvantage that the core thickness has to match the electrical device length, only copper plates on the top and bottom of the dedicated core layer may be contacted, an asymmetry of the board stack-up may be caused and the standard manufacturing steps have to be modified.

In contrast, the present invention may have the advantage of being applicable to printed circuit boards without changing the standard manufacturing process flow or the symmetry of the board. Furthermore, no adjustment of layer thicknesses to the dimensions of the electrical device to be embedded is required. The method of embedding an electrical device according to the present invention rather starts after the board layer stack-up build is completed, for example, using a standard printed circuit board.

Thus, in one aspect, the invention relates to a method for embedding a discrete electrical device in a printed circuit board, the discrete electrical device including a first and a second electrical contact, the printed circuit board comprising a horizontal top surface and a horizontal bottom surface, the printed circuit board further comprising a plurality of horizontal core sections vertically arranged above each other between the top and bottom surface, each core section comprising a lower and an upper horizontal electrically conductive layer, each core section further comprising a horizontal electrically non-conductive core layer arranged between the lower and the upper electrically conductive layer, the method including:
  providing a vertical via in form of a blind hole from one of the horizontal surfaces of the printed circuit board to an electrically conductive structure in a first layer, the first layer being one of the layers of a first one of the core sections, inserting the discrete electrical device into the via, the discrete electrical device extending from the electrically conductive structure in the first layer along the longitudinal axis of the via within at least two of the core sections, establishing a first electrically conductive connection between the first electrical contact and the electrically conductive structure in the first layer, establishing a second electrically conductive connection between the second electrical contact and a second layer, the second layer being one of the electrically conductive layers of a second one of the core sections.

In a further aspect, the invention relates to a printed circuit board with a discrete electrical device embedded therein, the printed circuit board including:

a horizontal top surface and a horizontal bottom surface, a plurality of horizontal core sections vertically arranged above each other between the top and bottom surface, each core section comprising a lower and an upper horizontal electrically conductive layer, each core section further comprising a horizontal electrically non-conductive core layer arranged between the lower and the upper electrically conductive layer, the discrete electrical device being arranged in a vertical via provided in the printed circuit board, the via having the form of a blind hole extending from one of the horizontal surfaces of the printed circuit board to an electrically conductive structure in a first layer, the first layer being one of the layers of a first one of the core sections, the discrete electrical device extending from the electrically conductive structure in the first layer along the longitudinal axis of the via within at least two of the core sections, the discrete electrical device comprising a first and a second electrical contact, the first electrical contact being electrically conductive connected with the electrically conductive structure in the first layer, the second electrical contact being electrically conductive connected with a second layer, the second layer being one of the electrically conductive layers of a second one of the core sections.

In order to enable using embedded electrical devices in a more general way, the present invention proposes embedding electrical devices into blind vias generated in, for example, drilled into, the printed circuit boards after manufacturing, that is, after the layer of the board have been combined. In contrast to buried vias, which are implemented into a printed circuit board during the manufacturing process of the same, that is, during combining of the layers, the length of the vias is not limited to the thickness of a core layer, but the blind via generated afterwards may extend through multiple core sections.

A further advantage of the present invention may be that interference with other electrical devices is prevented by embedding the electrical devices separated from each other within the printed circuit board.

An exemplary embedded electrical device according to the present invention may be a capacitor, in particular a surface mount technology (SMT) capacitor, vertically inserted in a board stack-up, as well as a resistor, an inductor, a filter or a diode like e.g. a Zener diode. All the aforementioned electrical devices may for example be used in the form of standard SMT components.

Surface mount technology is a method for producing electronic circuits in which the components, so called surface mount components, are mounted or placed directly onto the surface of printed circuit boards. In surface mount technology generally standardized components are used. An electronic device so made is called a surface mount device (SMD).

For modern electrical systems voltage stabilization becomes more and more critical. The reduction of power noise is a requirement in every computer system as well as many other digital circuits. For reducing power noise decoupling capacitors may be used.

Decoupling capacitors providing an effective way to reduce the impedance of power delivery systems operating at high frequencies may be used to manage power supply noise. A decoupling capacitor acts as a local reservoir of charge, which is released when the power supply voltage at a particular current load drops below a predefined level. Due to the inductance scaling slowly, the location of the decoupling capacitor may significantly affect the design of power/ground networks in high performance integrated circuits such as microprocessors. At higher frequencies, a distributed system of decoupling capacitors may need to be placed on-chip to effectively manage the power supply noise.

Due to the limited space on the surfaces of printed circuit boards, one capacitor type commonly used is the SMT type. Even though the body size of the SMT capacitor has been shrinking during the last years, the demand for even smaller capacitor types with higher capacities is growing, since the capacitors need to cover high frequency ranges in different fields of application. The limiting factor for the capacitor efficiency is the internal parasitic inductance and resistance. Smaller capacitors prove a smaller parasitic inductance and resistance. Due to the reduction of the capacitor size over the past years, it turned out that connecting vias between decoupling capacitors and the internal power layers, i.e. electrically conductive layers, of the circuit boards are becoming the limiting factors for the decoupling efficiency. In order to improve the decoupling capacitor efficiency, the connecting vias and therefore also the parasitic via inductance may be eliminated by embedding the capacitor inside the via in the board stack-up.

Electrical devices directly embedded in vias do not require additional connecting vias from the electrical devices to internal layers anymore. In case of an SMT capacitor these connecting vias may be the connections to power and grounded layers. According to the present invention the electrical device may be embedded in a single via connection a power and a grounded layer. Thereby, the parasitic inductance and resistance caused by the previously used additional vias may be avoided. In summary, this placement of an electrical device provides several advantages: increased efficiency of the component, e.g. an increased efficiency of power noise reduction in case of a decoupling capacitor; no mechanical keep out areas are needed on the top or bottom side of the printed circuit board, allowing an increased component density, embedded electrical devices may e.g. be placed in vias underneath the mechanical keep out areas of other components, like common SMT components mounted on the surface; damage of the embedded electrical devices may be avoided during assembly or repair processes of adjacent components soldered on the board; electrical devices embedded in blind vias may be placed between conductive layers, e.g. copper layers, of different core sections, e.g. SMT capacitors embedded in blind vias may be placed between power and grounded layers of different core sections; introduction of restrictions for the board power layer stack-up due to the size of the embedded electrical devices are prevented.

Furthermore, the present invention may have the advantage that blockages of PTHs may be avoided as well as a blockage of the wiring embedded in the printed circuit board by electrical devices placed on a surface of the PCB.

Additionally, the present invention may allow minimizing the printed circuit board size and/or production costs. Avoiding electrical devices being mounted on a surface of the printed circuit board by embedding the same into the board may have the advantage that the thickness of the printed circuit board with the respective electrical devices is smaller compared with embodiments, wherein the electrical devices are mounted on the surface.

According to an example, a plurality of electrical devices may be embedded in a printed circuit board using the aforementioned method. According to an example, a via is provided according to the aforementioned method for each electrical device to be embedded resulting in an electrical device embedded in each via provided. According to another example, more than one electrical device may be inserted into the same via, that is, one or more additional electrical devices may be placed above a first electrical device embedded in said via according to the aforementioned method. Each electrical device being connected with a different pair of electrically conductive layers of the printed circuit board. The space between the electrical devices inserted in the same via may be filled with an electrically non-conductive fill material.

According to an example, the inserted discrete electrical device extends within at least three of the core sections.

This may have the advantage that the dependency of the length of the embedded electrical device is decoupled from the thickness of the core layers. The first layer to which the via is provided and thus the number of core sections through which the vertical via extends may be chosen based on the length of the electrical device to be inserted into the printed circuit board. Thereby, electrical devices of different length may be implemented into the same printed circuit board without requiring a larger thickness of the printed circuit board due to longer electrical devices to be implemented. In order to embed a longer device, the provided via may be deeper, e.g. drilled deeper into the printed circuit board.

According to an example, the method may further comprise establishing the first electrically conductive connection by inserting an electrically conductive paste into the via underneath the discrete electrical device.

This may have the advantage that an efficient electrically conductive connection is generated.

According to an example, the conductive paste inserted into the via underneath the discrete electrical device may be solder paste. The method may further comprise soldering with the inserted solder paste.

The solder paste may comprise a powder metal solder suspended in a flux. The solder composition may e.g. comprise a tin-lead alloy with possibly a third metal alloy. The solder composition may e.g. be tin-lead (like e.g. Sn63Pb37), tin-silver-copper (SAC) alloys (like e.g. Sn96.5Ag3Cu0.5) or tin-antimony (like e.g. Sn95Sb5). The flux may e.g. comprise ammonium chloride or rosin for soldering tin.

This may have the advantage that an efficient electrically conductive connection is generated. Furthermore, the device is fixed due to the soldering. The soldering may be performed using for example hot gas, laser or infrared radiation.

Instead of using a solder paste for generating an electrical conductive connection, in an alternative embodiment, a conductive fill material may be used without soldering. For example, an epoxy matrix filled with conductive particles like copper particles, silver particles and/or silver coated copper particles may be applied which provides electrical (and thermal) conductivity in a cured state.

According to an example, the method may further comprise inserting electrically non-conductive fill material into the via around the discrete electrical device from the first electrical contact up to the second electrical contact.

This may have the advantage that the position of the electrical device within the printed circuit board is stabilized. Furthermore, this may have the advantage that soldering paste inserted into the via on top of the discrete electrical device for establishing the second electrically conductive connection is prevented from flowing downwards when being soldered. In case of a non-solder conductive fill material being inserted into the via on top of the discrete electrical device for establishing the second electrically conductive connection, the electrically non-conductive fill material may prevent the non-solder conductive fill material from extending downwards before being cured. The electrically non-conductive fill material may e.g. be a non-conductive epoxy paste.

According to another example, the method may further comprise establishing the second electrically conductive connection by inserting an electrically conductive paste into the via on top of the discrete electrical device.

This may have the advantage that an efficient electrically conductive connection is generated.

According to an example, the conductive paste inserted into the via on top of the discrete electrical device may be a solder paste. The method may further comprise soldering with inserted the solder paste.

This may have the advantage that an efficient electrically conductive connection is generated. Furthermore, the device is fixed due to the soldering. The soldering may be based on hot gas, laser or infrared radiation.

Instead of using a solder paste for generating an electrical conductive connection, in an alternative embodiment, a conductive fill material may be used without soldering. For example, an epoxy matrix filled with conductive particles like copper particles, silver particles and/or silver coated copper particles may be applied, which provides electrical (and thermal) conductivity in a cured state.

According to an example, the method may further comprise inserting electrically non-conductive fill material into the via from the second electrical contact up to the horizontal surface of the printed circuit board.

This may have the advantage that the electrical device is further stabilized within the printed circuit board and the via is filled up providing a plane horizontal surface of the printed circuit board, i.e., top or bottom surface. The electrically non-conductive fill material may, for example, be a non-conductive epoxy paste.

According to an example, the method may further comprise arranging a lid onto the opening of the via in the horizontal surface of the printed circuit board.

This may have the advantage that an exposure of the fill material in the via is avoided. Thereby, the mechanical load capacity of the board is improved.

According to one or more examples, the printed circuit board may further comprise a plated through hole extending vertically from the top to the bottom surface, and providing the vertical via in the form of a blind hole may include:

drilling the vertical via into the plated through hole, thereby expanding the horizontal cross section of a vertical portion of the plated through hole by the horizontal cross section of the via, the electrically conductive structure in the first layer comprises the unexpanded end of the plated through hole at the end of the drilled via.

This may have the advantage that pre-existing plated through holes of the printed circuit board may be used for embedding electrical devices into the printed circuit board. By using pre-existing plated through holes, accidentally marring or tearing discrete conductive paths like wires within conductive layers may be avoided.

According to an example, providing the vertical via in form of a blind hole may further comprise:
providing a closed bottom for the via forming a blind hole by inserting an electrically conductive barrier into the via onto the electrically conductive structure in the first layer.

This may have the advantage that the fixation of the position of the electrical device within the printed circuit board is improved and that the electrical conductivity of the first electrical contact of the electrical device is improved. Furthermore, electrically conductive paste like solder paste is prevented from extending into the plated through hole.

According to an example, an electrically conductive barrier is provided with electrically conductive solder paste on top and bottom to create a reliable electrical contact between the discrete electrical device and the electrically conductive structure after soldering.

According to an example, the first layer is one of the electrically conductive layers of the first core section.

According to an example, at least one of the first and second electrically conductive layer comprises a discrete electrically conductive path.

This may have the advantage that the electrical device may provide a serial capacitor in a signal path in a printed circuit board. The discrete electrically conductive path may, for example, be a wire extending horizontally on or within a nonconductive material. The electrically conductive layer may comprise a plurality of discrete electrically conductive paths.

According to an example, at least one of the first and second electrically conductive layer is configured as a continuously electrically conductive layer.

This may have the advantage that the different conductive layers may provide different continuous voltage levels. In one embodiment, each core section may comprise an electrically conductive layer that is grounded, i.e., a grounded layer, and an electrically conductive layer establishing a non-zero voltage level, i.e., a power layer.

According to an example, the first electrically conductive layer is the upper electrically conductive layer of the first core section and the second electrically conductive layer is the lower electrically conductive layer of the second core section.

According to another example, the first electrically conductive layer is the lower electrically conductive layer of the first core section, and the second electrically conductive layer is the upper electrically conductive layer of the second core section.

This may have the advantage that the present invention allows for connecting different conductive layers of different core sections, whereby grounded layers may be connected with different voltage levels. Thereby, a great variety of distances between different conductive layers is provided allowing embedding a great variety of electrical devices with different lengths.

According to an example, one of the first and second electrically conductive layer may be grounded. In other words, for example, either the first or the second conductive layer may be grounded.

According to an example, the discrete electrical device comprises a third electrical contact arranged between the first and second electrical contact.

According to an example, a third electrically conductive connection between the third electrical contact and a third electrically conductive layer of a third one of the core sections may be established, the third core section being arranged between the first and second core section.

According to an example, the third electrically conductive layer may be grounded.

This may have the advantage that it allows for integrating two capacitors within one electrical device. The third electrical contact may be connected with a grounded conductive layer, while the first and the second contact may be contacted with conductive layers of different core sections establishing different or identical voltage levels. Thus, the grounded conductive layer may be used for both capacitors.

According to an example, the third electrically conductive layer may be connected to a voltage, while the two other conductive layers are grounded.

This may have the advantage that it allows for integrating two capacitors connected to one voltage in parallel within one electrical device.

According to an example, the discrete electrical device may have a cylindrical form.

This may have the advantage that the space provided by the vias may be used more efficiently, allowing for a larger volume of the embedded electrical devices without changing their lengths. For example, this may allow for larger capacities. Furthermore, this may allow for smaller vias accommodating electrical devices with unchanged capacity. Smaller cross-sections of vias may avoid larger resistances, and allow for a larger number of vias without changing the resistances of the printed circuit board.

Standardized block-shaped rectangular SMT components may have a square cross-section. Table 1 lists certain standard SMT types and their respective diameters, i.e. the length of their cross-section diagonal. The table further lists for each SMT component the diameter of the smallest standard drills having a diameter larger than the diameter required by the SMT component.

TABLE 1

SMT Device Diameters

| type | width [mm] | length [mm] | diameter [mm] | drill [mm] | diameter [mils] | drill [mils] |
|------|------------|-------------|---------------|------------|-----------------|--------------|
| 01005 | 0.20 | 0.40 | 0.283 | 0.30 | 11.136 | 12 |
| 0201 | 0.30 | 0.60 | 0.424 | 0.45 | 16.703 | 17 |
| 0402 | 0.50 | 1.02 | 0.707 | 0.75 | 27.839 | 28 |

Considering Table 1, it becomes apparent that the difference between the diameter required by the SMT component and its width (which is identical with its height) becomes larger as the dimensions of SMT component become lager: 0.083 mm for the 01005 type component, 0.124 mm for the 0201 type component and 0.207 mm for the 0402 type component. With cylindrical electrical devices not only unused space due to the different forms of the cross-sections of the devices and the vias may now be efficiently used, but the diameters of the cylindrical electrical devices may further be optimized such that they correspond to the diameter of standard drills provided for drilling the vias. A cylindrical device with the same volume and length as a type 01005 device e.g. has a diameter of 0,226 mm, i.e. 0.057 mm less, for a type 0201 device the cylindrical diameter is 0.339 mm, i.e. 0.085 mm less, and for a type 0402 device the cylindrical diameter is 0.564 mm, i.e. 0.143 mm less.

Furthermore, typical plated-through holes have a 12 mil drilled diameter, i.e. 0.3 mm, and a 10 mil plated diameter, i.e. 0.25 mm. Using 12 mil, 17 mil or 28 mil drill, typical plated-through holes may be efficiently back-drilled for inserting standardized type 01005, type 0201 and type 0402 devices, respectively.

According to an example, the discrete electrical device may be an SMT component.

This may allow for using known standardized components. Standardized surface mount components may have the advantage to be smaller than their counterparts with leads, and are designed to be handled by machines rather than by humans. The electronics industry has standardized package shapes and sizes, wherein a leading standardisation body is the Joint Electron Device Engineering Council (JEDEC). The codes given in Table 2 below usually refer to the length and width of the components in tenths of millimeters (metric size) or hundredths of inches (imperial size). It is understood that the lengths and widths given below are assigned with precision tolerances. For example, a metric 2520 component is 2.5 mm by 2.0 mm which corresponds roughly to 0.10 inches by 0.08 inches. Hence, it is referred to as imperial size 1008. Exceptions regarding this system of assignment may occur for imperial sizes in the smallest rectangular sizes. However, the metric codes in general may still represent the dimensions in mm, even though the imperial size codes may no longer be aligned.

TABLE 2

Standardized device sizes

| Type | | Dimension | | | |
|---|---|---|---|---|---|
| metric | imperial | length [mm] | width [mm] | length [inch] | width [inch] |
| 0402 | 01005 | 0.40 | 0.20 | 0.016 | 0.008 |
| 0603 | 0201 | 0.60 | 0.30 | 0.024 | 0.012 |
| 1005 | 0402 | 1.02 | 0.50 | 0.040 | 0.020 |
| 1310 | 0504 | 1.27 | 1.02 | 0.050 | 0.040 |
| 1608 | 0603 | 1.60 | 0.80 | 0.063 | 0.031 |
| 2012 | 0805 | 2.00 | 1.25 | 0.079 | 0.050 |
| 2318 | 0907 | 2.29 | 1.78 | 0.090 | 0.070 |
| 2520 | 1008 | 2.50 | 2.00 | 0.098 | 0.078 |
| 3216 | 1206 | 3.20 | 1.60 | 0.126 | 0.063 |

An exemplary PCB according to the present disclosure may comprise a structure and dimensions as listed in Table 3:

TABLE 3

PCB layer structure and thicknesses
Table 3: PCB layer structure and thicknesses

| | layer type | layer thickness [mm] | total thickness [mm] |
|---|---|---|---|
| | MP | 0.061 | 0 |
| | fill | 0.147 | 0.147 |
| GND | P2 | 0.031 | 0.178 |
| | core | 0.114 | 0.292 |
| V1 | P3 | 0.064 | 0.356 |
| | fill | 0.137 | 0.493 |
| GND | P4 | 0.064 | 0.557 |
| | core | 0.114 | 0.671 |
| V2 | P5 | 0.031 | 0.702 |
| | fill | 0.142 | 0.844 |
| GND | P6 | 0.064 | 0.908 |
| | core | 0.114 | 1.022 |
| V3 | P7 | 0.064 | 1.086 |
| | fill | 0.142 | 1.228 |
| GND | P8 | 0.031 | 1.259 |
| | core | 0.102 | 1.361 |
| S | S9 | 0.031 | 1.392 |

The PCB according to Table 3 comprises a mounting plane layer MP, seven conductive layers P2 to P8, wherein layers P2, P4, P6 and P8 are grounded, while layers P3, P5 and P7 are power layers: layer P3 has voltage level V1, layer P5 voltage level V2 and layer P7 voltage level V3. The mounting plane layer MP is the outermost layer of the printed circuit board providing the top surface for mounting SMT devices thereon. The grounded layers as well as the power layers are continuous electrically conductive layers, i.e. the whole layer provides a continuous voltage. These layers are followed by layer S9 which is a signal layer. Signal layers are layers with one or more discrete electrically conductive paths horizontally embedded therein. Adjacent conductive layers, i.e. grounded layers, power layers and/or signal layers, form core sections each comprising a group of two conductive layers with an electrically non-conductive core layer arranged in between. The core sections are laminated together by non-conductive fill layers arranged in between. A core section may for example comprise a grounded conductive layer and a conductive layer with a non-zero voltage level or it may comprise two conductive layers with a non-zero voltage levels. The conductive layers with non-zero voltage layers may either be power layers, i.e. continuously electrically conductive layers, or signal layers, i.e. layers comprising discrete electrically conductive paths. Further, the order of the grounded conductive layer and a conductive layer of the core sections may vary.

An embodiment of a PCB may be symmetrical with respect to an imaginary horizontal plane vertically arranged in the middle between the horizontal top and the bottom surface of the PCB. An embodiment may comprise core sections with signal layers vertically arranged in the middle between the horizontal top and the bottom surface of the PCB, while core sections with power layers are arranged between the core sections with signal layers and the horizontal top and the bottom surface, respectively. In an alternative embodiment core sections with power layers may be vertically arranged in the middle between the horizontal top and the bottom surface of the PCB, while core sections with signal layers are arranged between the core sections with power layers and the horizontal top and the bottom surface, respectively.

For example, the distance between the grounded layer P2 and the non-zero voltage level P6 is 0.666 mm, the distance between the non-zero voltage level P4 and grounded layer P8 is 0.671 mm. Both distances correspond to the length of a type 0201 component which is 0.6 mm. Thus, a type 0201 component perfectly fits in between those layers.

According to an example, the discrete electrical device is a capacitor, a resistor, an inductor, a filter or an active component.

This may allow for a broad variety of usages of the present invention. An active component may for example be a Z-diode, i.e. a Zener diode allowing current to flow in the forward direction in the same manner as an ideal diode, but permitting the current to flow in the reverse direction when the voltage is above a certain value known as the breakdown voltage. In one example the discrete electrical device a capacitor, a resistor, an inductor, a filter or an active component in form of an SMT component.

FIG. 1 shows a schematic of a partial view of a vertical cross-section of a first multi-layer printed circuit board 100. The circuit board 100 comprises a plurality of core sections. Three core sections 116, 118, 120 are shown in the cross-section of FIG. 1. Each core section 116, 118, 120 comprises a lower electrically conductive layer 124, 128, 132 and an upper electrically conductive layer 122, 126, 130. Each core section 116, 118, 120 further comprises a horizontal electrically non-conductive core layer 136 arranged in between the lower and the upper corresponding electrically conductive layers. The core sections 116, 118, 120 are laminated together by an electrically non-conductive fill material layers 138 arranged between each of the core sections. The non-conductive fill material may be identical with the material of the core layers 136. The conductive layer 134 and the non-conductive layer 114 may be part of a further core section not shown in its entirety. The layer 112 is an electrically non-conductive fill material layer on which the mounting plane layer 111 is arranged. The mounting plane layer 111 provides the horizontal top surface of the printed circuit board and may contain electrical conductive structures as well. The conductive layers 122, 128 and 134 are grounded. The conductive layers 124, 126, 130 and 132 are power layers. The conductive layer 124 establishes a first voltage level V1, the conductive layer 126 a second voltage level V2, the conductive layer 130 a third voltage level V3 and the conductive layer 132 a fourth voltage level V4.

In the example shown in FIG. 1 some of the conductive layers, i.e. layers 122, 124, 126, 128, 130, and 134, comprise one or more voids 113 forming clearance holes through the respective layers perpendicular to the plane of the printed circuit board. The voids 113 are filled with non-conductive fill material due to the laminating of the core sections 116, 118, 120 with the electrically non-conductive fill material layers 138. The position and size of the voids 113 may be provided by a void position map.

Figure 2:
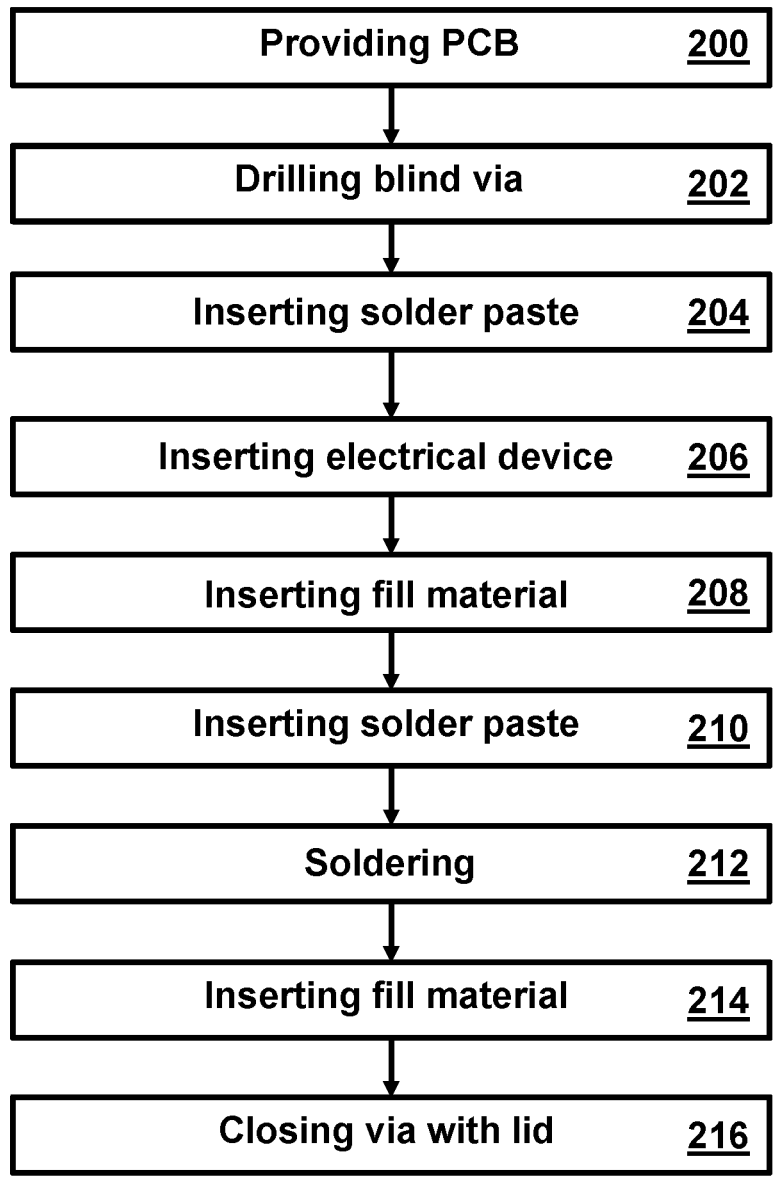
FIG. 2 is a flowchart describing an exemplary first method of embedding a discrete electrical device in the first PCB of FIG. 1, in accordance with one or more aspects of the present invention.

Electrical devices may be embedded within the printed circuit board of FIG. 1 by the following additional manufacturing steps according to the schematic flowchart depicted in FIG. 2. In step 200, the printed circuit board is provided without embedded electrical devices, that is, it is built with all core sections combined according to a standardized manufacturing process. In step 202, a blind via is drilled into the printed circuit board until a specific voltage level or grounded layer is reached without cutting the respective destination layer. The blind via may be drilled and/or finished with a laser to clean the power layer without penetrating the same. In step 204, the bottom of the blind via is filled with a solder paste. In step 206, an electrical device, for example, an SMT capacitor, is inserted into the via. In step 208, the via is filled with electrically non-conductive fill material up to the top of the inserted electrical device. In case of an electrical device with an additional electrical contact arranged in the middle, the via may be filled with electrically non-conductive fill material up to the additional contact, solder paste may be inserted to the additional contact and the remaining via may be filled up to the top of the electrical device with electrically non-conductive fill material. In step 210, solder paste is inserted on top of the electrical device up to the next voltage level or grounded layer. In step 212, the solder paste is soldered, for example, by a hot gas, laser or infrared soldering process. According to an alternative embodiment of the method, the first portion of solder paste inserted in step 204 may already be soldered in the end of step 206. If additional solder paste is inserted in step 208, the additional solder paste may already be soldered during step 208. The electrically non-conductive fill material inserted around the electrical devices prevents the solder paste arranged on top of the electrical device to flow downwards, thus ensuring an effective electrically conductive connection of the upper, i.e. second, electrical contact of the electrical device. In step 214 the rest of the blind via is filled up with electrically non-conductive fill material. In step 216, the blind via may be closed with a lid placed on the respective surface of the printed circuit board.

Figure 3:
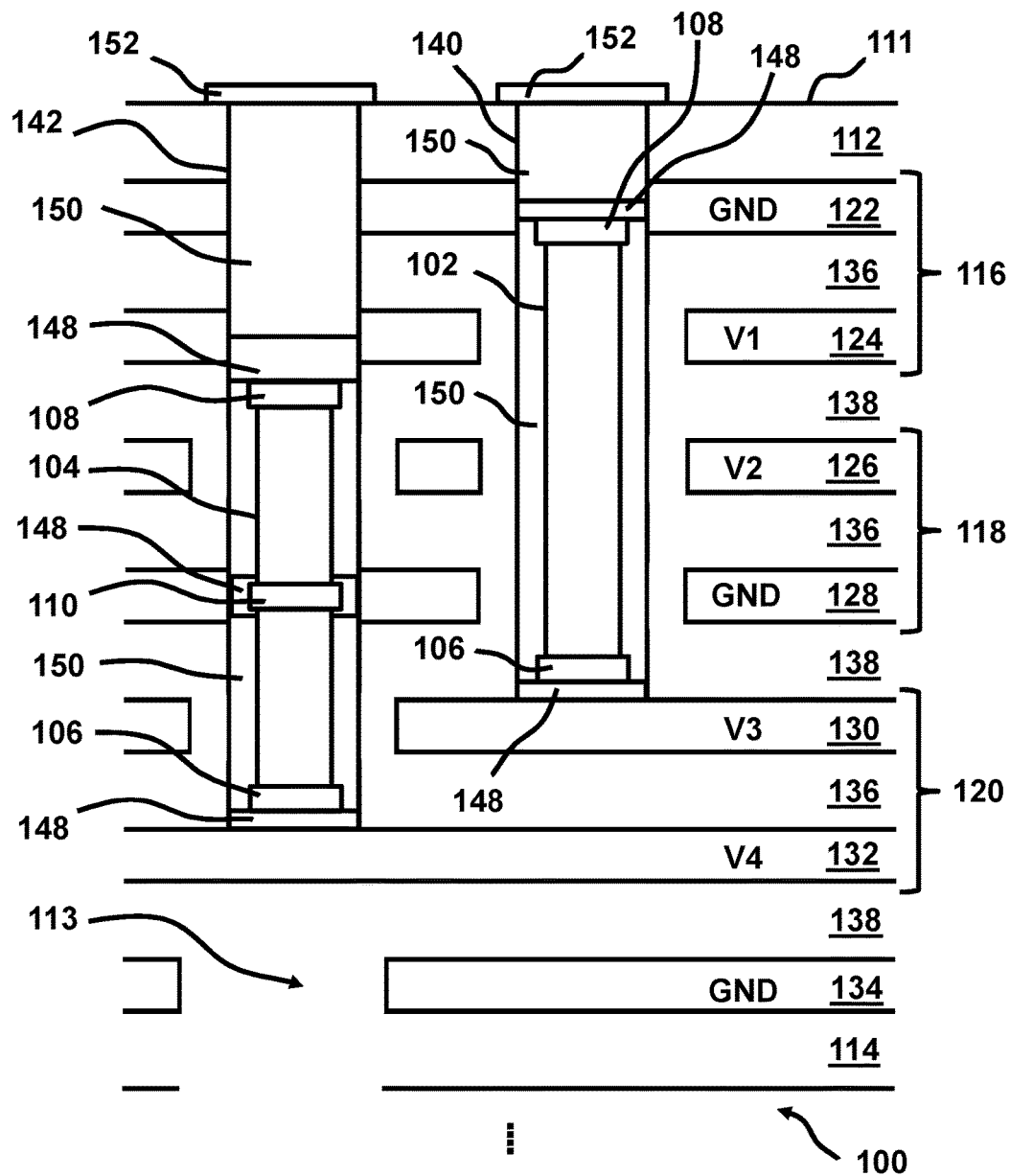
FIG. 3 depicts a schematic of a partial cross-section through the first exemplary PCB of FIG. 1 after embedding of discrete electrical devices, in accordance with one or more aspects of the present invention.

FIG. 3 depicts the printed circuit board 100 according to FIG. 1 with electrical devices 102 and 104 embedded therein using, for instance, the method according to FIG. 2. Two blind vias 140, 142 are drilled into the printed circuit board 100 from the horizontal top surface 111 on the layer 112. The first via 140 is drilled down to the third voltage level V3 of the conductive layer 130, while the second via 142 is drilled down to the fourth voltage level V4 of conductive layer 132. The diameters of the vias 140, 142 are both smaller than the diameters of the voids 113. The bottom of via 140 is filled with soldered solder paste 148. The soldered solder paste 148 establishes an electrically conductive connection between the first electrical contact 106 of the discrete electrical device 102 and the conductive layer 130. The space around the electrical device 102 is filled up with electrically non-conductive fill material 150 up to the second electrical contact 108. The second electrical contact 108 is electrically connected with the grounded layer 122 of the printed circuit board 100 by soldered solder paste 148 placed on top of the electrical device 102. The location of via 140 is chosen such that the conductive layers 122, 130, which are electrically connected with the electrical device 102, do not comprise a void at the respective location. The remaining via 140 is filled up to the outer surface 111 of the PCB 100 with electrically non-conductive fill material 150. On top of the via 140 a lid 152 is placed covering the mouth of the via 140.

The second electrical device 104 is embedded in the second via 142 analogously. The second electrical device comprises an additional third electrical contact 110 besides the first and the second electrical contacts 106, 108. The first electrical contact 106 is electrically connected with the fourth voltage level V4 of conductive layer 132, while the second electrical contact 108 is electrically connected with the first voltage level V1 of conductive layer 124. The third electrical contact 110 is connected with the grounded conductive layer 128 arranged between conductive layers 124 and 132. Thus, the electrical device 104 may, for example, comprise two capacitors the first of which is arranged between the voltage level V1 and ground, while the second one is arranged between voltage level V4 and ground. The location of via 142 is chosen such that the conductive layers 124, 128, 132 which are electrically connected with the electrical device 104 do not comprise a void at the respective location. In an another embodiment, a plurality of electrical devices may be arranged above each other within the same via, separated from each other by electrically non-conductive fill material.

Figure 4:
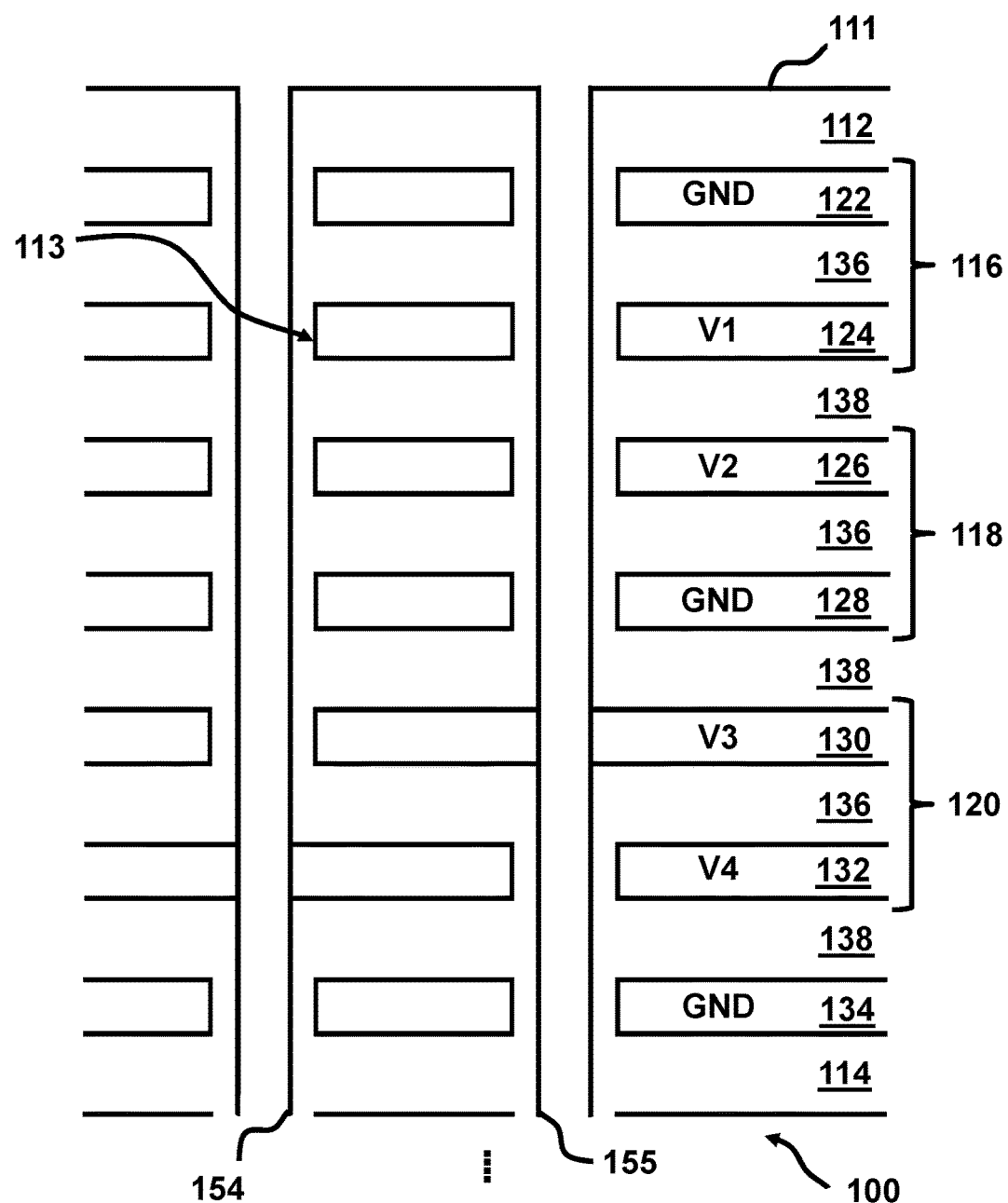
FIG. 4 depicts a schematic of a partial cross-section through a second exemplary PCB prior to embedding of discrete electrical devices, in accordance with one or more aspects of the present invention.

FIG. 4 depicts a schematic of a partial view of a cross-section of a second multi-layer printed circuit board 100, such as shown in FIG. 1. The printed circuit board according to FIG. 4 further comprises plated through holes 154, 155. In FIG. 4, two plated through holes 154, 155 are depicted each of which extends vertically throughout the printed circuit board 100 and comprises an inner surface covered with copper. In FIG. 4, all the conductive layers 122, 124, 126, 128, 130, 132, and 134 comprise voids 113 located concentrically above each other and filled with fill material from layers 112, 138. The plated through holes 154, 155 are arranged in the voids 113 such that they are not connected to any of the shown conductive layers 122, 124, 126, 128, 130, 132, and 134. The plated through holes 154, 155 may be connected with additional conductive layer (not shown) which do not comprise a void at the location of the plated through holes 154, 155.

Figure 5:
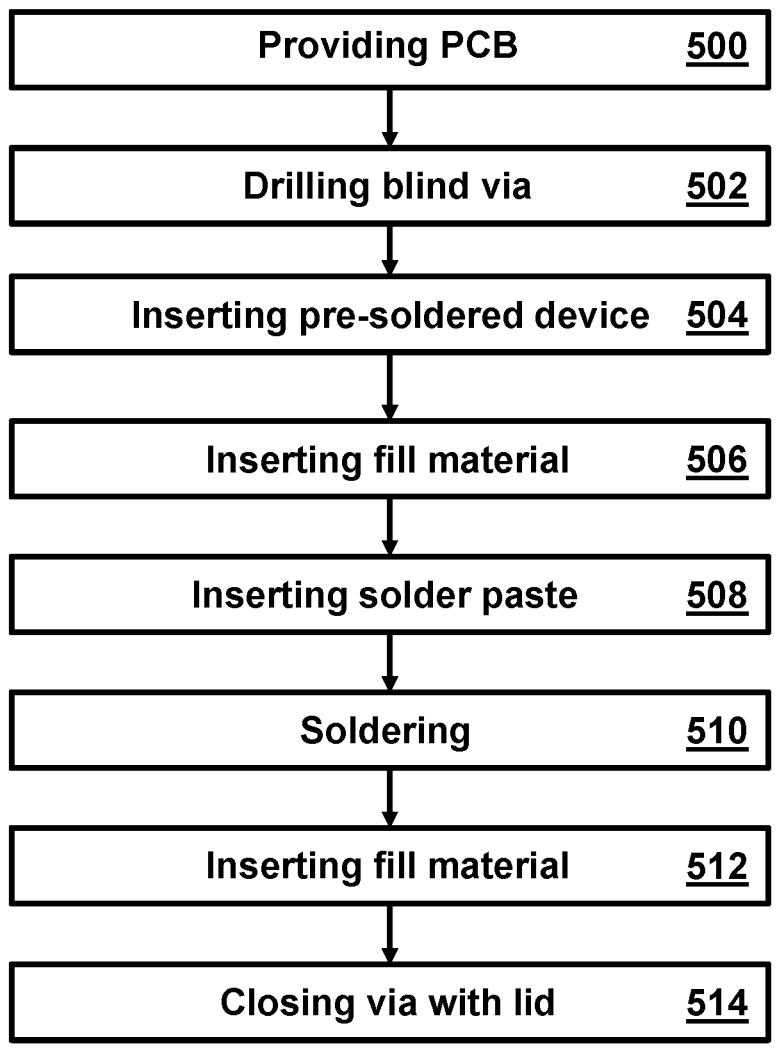
FIG. 5 is a flowchart describing an exemplary second method of embedding a discrete electrical device in the second PCB of FIG. 4, in accordance with one or more aspects of the present invention.

FIG. 5 depicts a flowchart of a method for embedding electrical devices within the printed circuit board according to FIG. 4, taking advantage of the printed circuit holes. In step 500, a printed circuit board according to FIG. 4 is provided, wherein the board is built up with all core sections and layers including the plated through holes. In step 502, dedicated plated through holes are back-drilled to a specific internal layer of the printed circuit board. The plated through holes may for example be back-drilled to a voltage level or grounded layer without cutting this layer or to a non-conductive layer. The back-drill via may be drilled and/or finished with a laser to clean the voltage layer without penetrating the same. When drilling the vertical via into the plated through hole, the horizontal cross-section of a portion of the plated through hole extending from the surface of the printed circuit board to the dedicated conductive layer is expanded by the horizontal cross-section of the drilled via, that is, the horizontal cross-section of the drilled via is larger than the horizontal cross-section of the plated through hole. In step 504, a pre-soldered electrical device, for example, a capacitor, which is soldered with an electrically conductive barrier, for instance, in form of a conductive circular plate, and solder paste is inserted into the back-drilled plated through hole. In step 506, the via is filled up with electrically non-conductive fill material around the inserted electrical device up to the top of the same. In case of an electrical device with an additional electrical contact arranged in the middle, the via may be filled with electrically non-conductive fill material up to the additional contact, solder paste may be inserted to the additional contact and the remaining via may be filled up to the top of the electrical device with electrically non-conductive fill material. In step 508, solder paste is inserted on top of the electrical device up to the next voltage level or grounded layer. In step 510, the inserted solder paste is soldered by a solder process, e.g. hot gas, laser or infrared soldering. According to an alternative embodiment of the method also the solder paste previously inserted in step 506 may have already been soldered in step 506. In step 512, the remaining blind via is filled up to the surface of the printed circuit board with electrically non-conductive fill material. Finally, in step 514 a lid is placed on the surface of the printed circuit board covering the mouth of the blind via drilled into the plated through hole.

Figure 6:
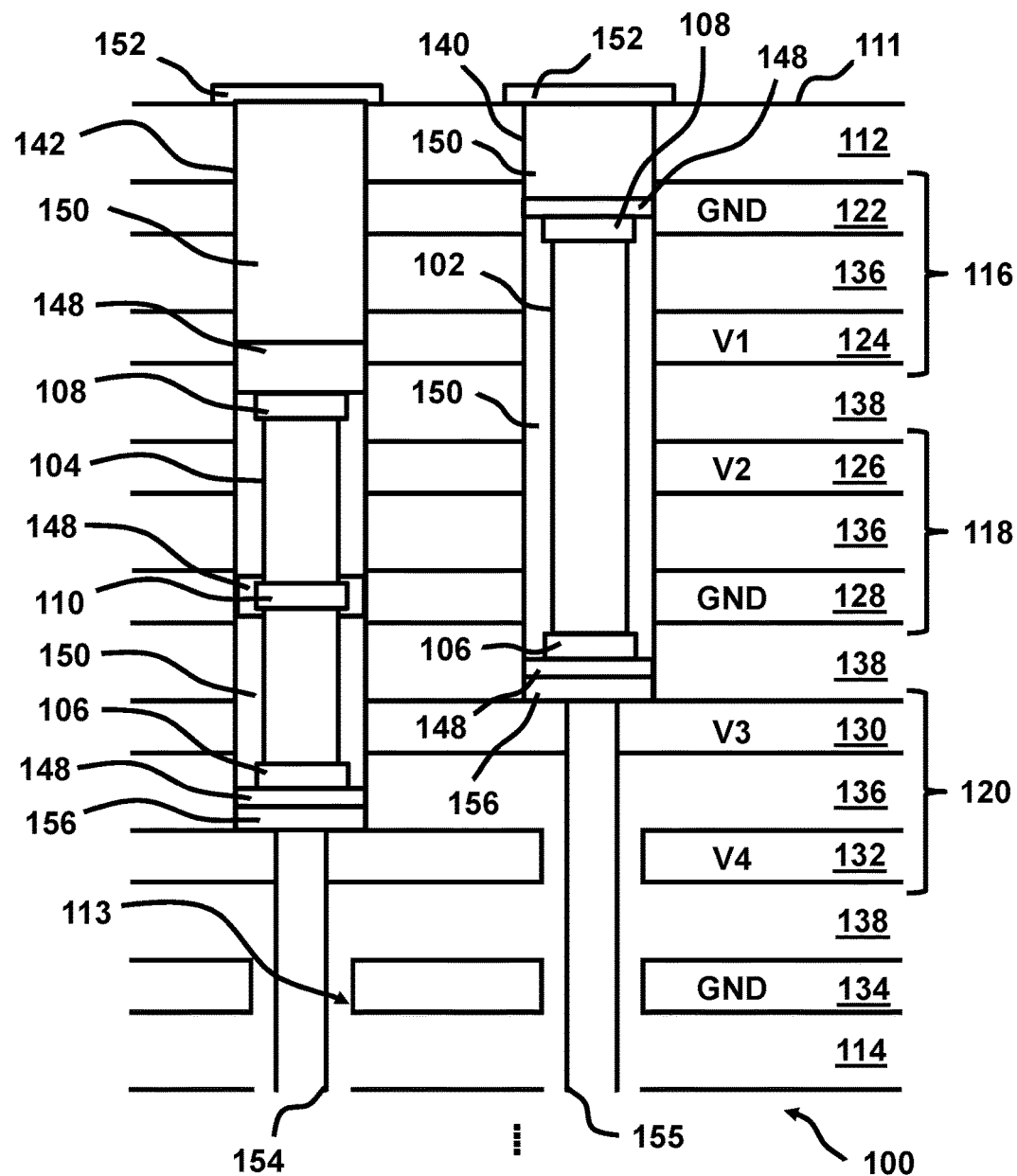
FIG. 6 depicts a schematic of a partial cross-section through the second exemplary PCB of FIG. 4 after embedding of discrete electrical devices, in accordance with one or more aspects of the present invention.

FIG. 6 shows a printed circuit board 100 into which a first electrical device 102 and a second electrical device 104 have been inserted. The resulting arrangement corresponds to the one shown in FIG. 3. The difference is due to the plated through holes 154, 155 prearranged within the printed circuit board 100 before applying the method according to FIG. 5 as well as the voids 113 around the plated through holes 154, 155. The vias 140, 142 are drilled into the plated through holes 154, wherein the horizontal cross-sections of the vias 140, 142 are larger than the horizontal cross-sections of the plated through holes 154, 155. At the lower ends of the vias 140, 142 drilled into the plated through holes 154, 155 electrically conductive barriers 156 are placed providing closed bottoms of the respective vias 140 and 142. The diameters of the vias 140, 142 of the example shown in FIG. 6 are both larger than the diameters of the voids 113 around the plated through holes 154, 155. According to another example, the diameters of one or both vias 140, 142 may be equal or smaller than the diameters of the voids 113 around the plated through holes 154, 155.

Figure 7:
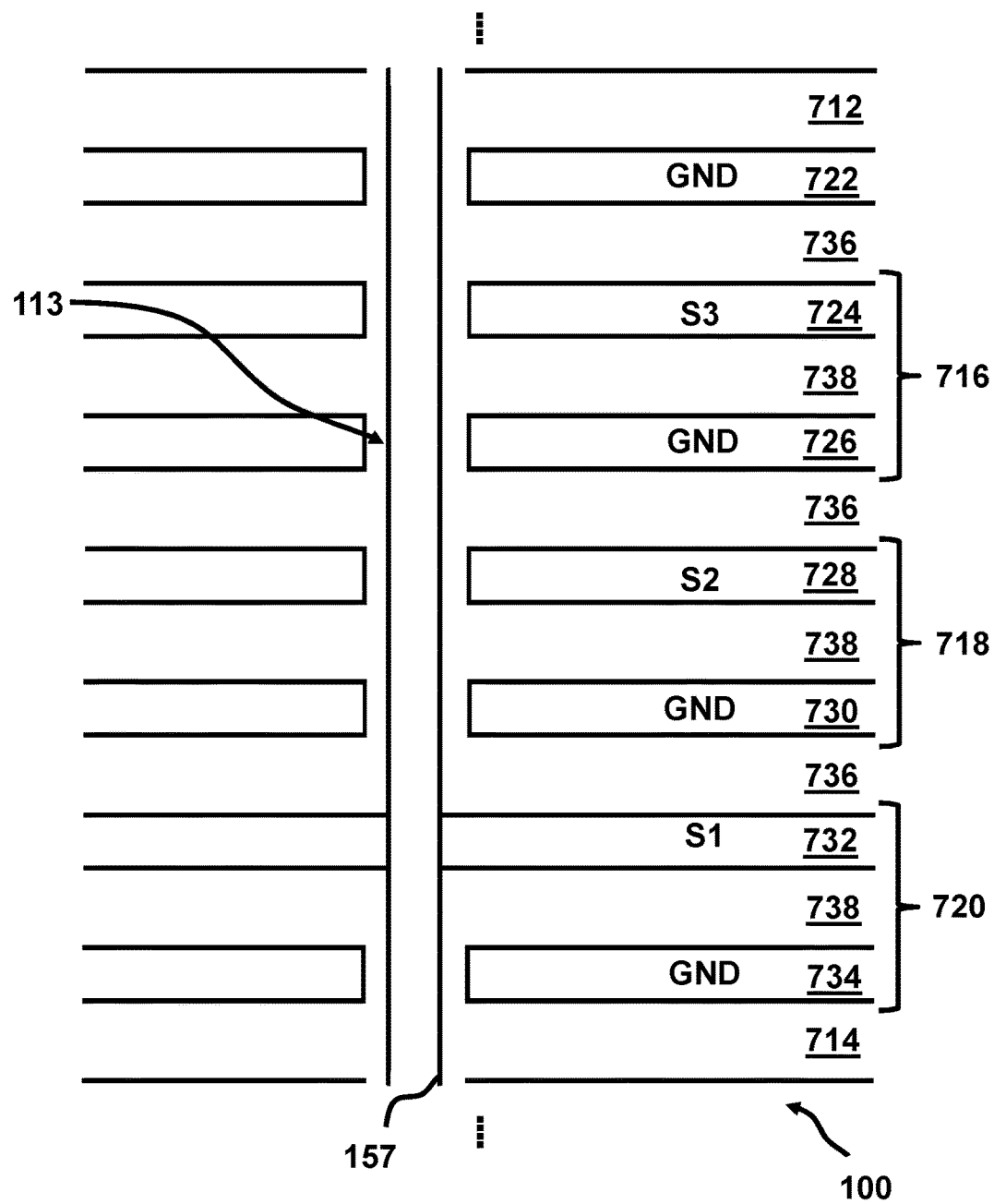
FIG. 7 depicts a schematic of a partial cross-section through a third exemplary PCB prior to embedding of discrete electrical devices, in accordance with one or more aspects of the present invention.

FIG. 7 shows a schematic of a partial view of a vertical cross-section of a third exemplary multi-layer printed circuit board 100. The circuit board 100 comprises a plurality of core sections. Three core sections 716, 718, 720 are shown in the cross-section of FIG. 7. Each core section 716, 718, 720 comprises a lower electrically conductive layer 724, 728, 732 and an upper electrically conductive layer 722, 726, 730. Each core section 716, 718, 720 further comprises a horizontal electrically non-conductive core layer 736 arranged in between the lower and the upper electrically conductive layer. The core sections 716, 718, 720 are laminated together by electrically non-conductive fill material layers 738 arranged between each pair of the core sections. Conductive layers may be implemented in form of signal layers, i.e. layers comprising an electrically non-conductive material with one or more discrete electrical conductive paths embedded therein. The electrical device may be implemented in form of a capacitor connecting conductive path of different layers. Thereby serial capacitors may be implemented. The conductive layers 724, 728 and 732 shown in FIG. 7 are signal layers comprising one or more discrete electrically conductive paths embedded horizontally therein. The conductive layer 722, 726, 730 and 734 are grounded. The plated through hole 157 has an electrically conductive connection with a signal path of signal layer 732. The other conductive layers 722, 724, 726, 728, 730, and 734 comprise voids 113 such that no electrically conductive connections with the plated through hole 157 are established. The partial view of FIG. 7 shows an inner portion of the printed circuit board 100.

Figure 8:
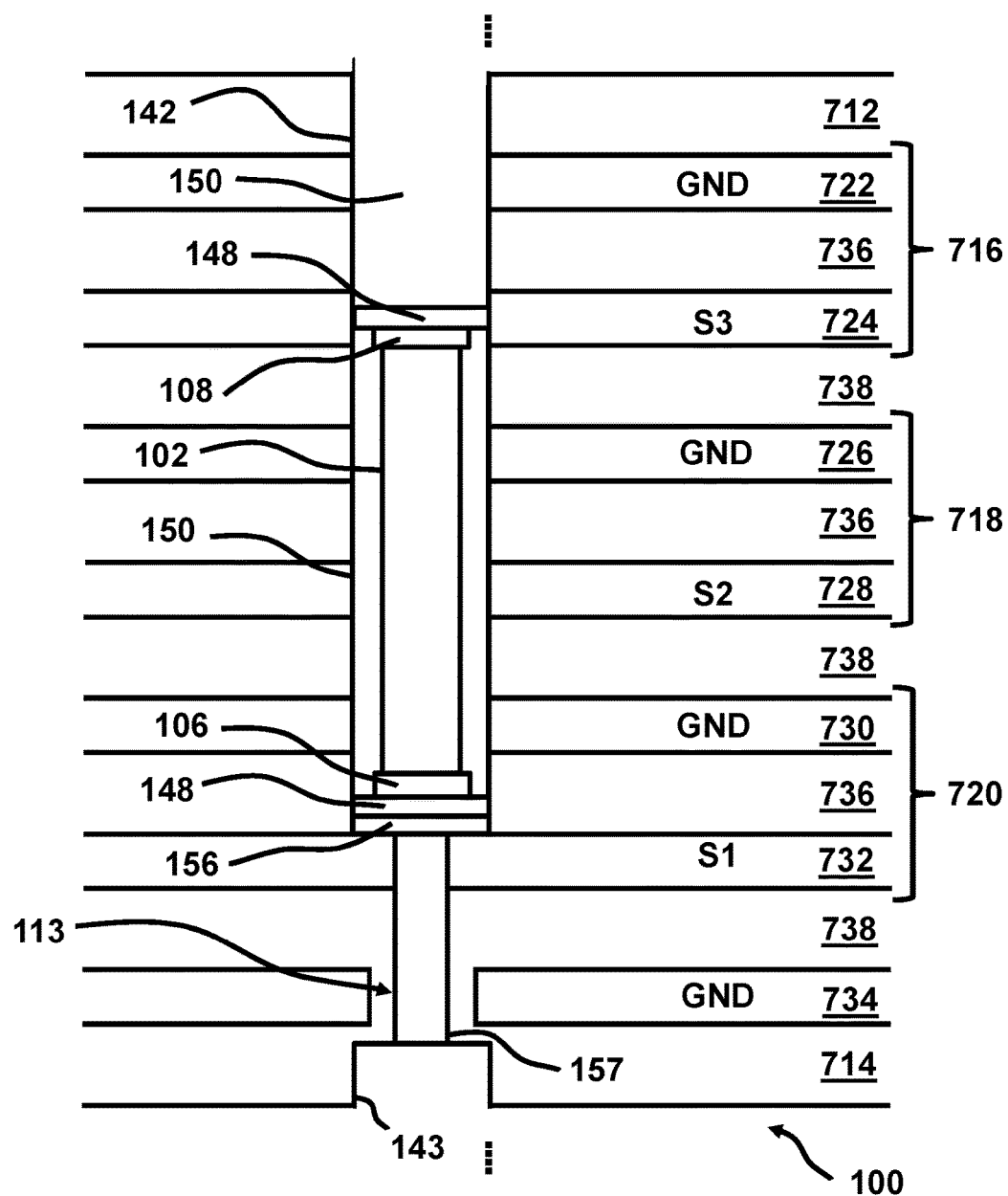
FIG. 8 depicts a schematic of a partial cross-section through the third exemplary PCB of FIG. 7 after embedding of a discrete electrical device, in accordance with one or more aspects of the present invention.

FIG. 8 shows the printed circuit board 100 of FIG. 7 into which an electrical device 102 has been inserted. The resulting arrangement corresponds to the one shown in FIG. 6. The via 142 has been drilled into the plated through hole 157 e.g. from the backside of the PCB 100. At the lower end of the via 142 drilled into the plated through hole 157 an electrically conductive barrier 156 is placed providing a closed bottom of the respective via 142 such that an electrically conductive connection with the signal layer 732 and the plated through hole 157 is established. The second electrical contact 108 is electrically conductive connected with the signal layer 724. Thus, the electrical device 102, e.g. a capacitor, is placed in the signal path from the signal layer 724 to the signal layer 732. In order to reduce noise caused by the remaining plated through hole 157, for example by high frequency signals reflected within the remaining plated through hole 157, an additional vertical via 143 may be drilled into the plated through hole 157 from the opposite surface of the PCB 100. Thereby, the remaining portion of the plated through hole 157 may be reduced to a minimum.

Figure 9:
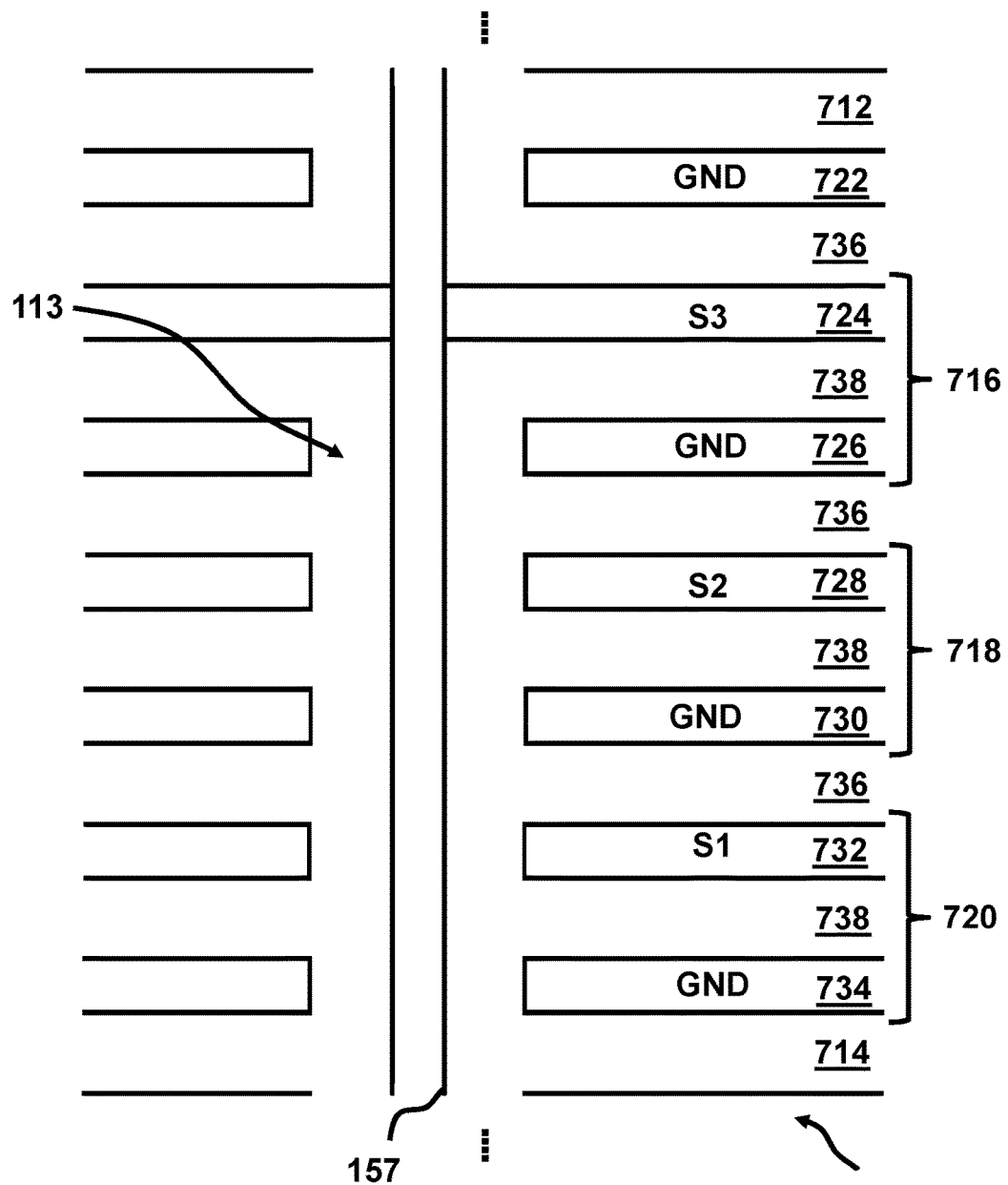
FIG. 9 depicts a schematic of a partial cross-section through a fourth exemplary PCB prior to embedding of discrete electrical devices, in accordance with one or more aspects of the present invention.

FIG. 9 shows a schematic of a partial view of a vertical cross-section of a fourth exemplary multi-layer printed circuit board 100. The shown portion of the circuit board 100 corresponds to the one shown in FIG. 7. The only difference may be that the plated through hole 157 has an electrically conductive connection with a signal path of signal layer 724 instead of layer 732. The other conductive layers 722, 726, 728, 730, 732 and 734 comprise voids 113 such that no electrically conductive connections with the plated through hole 157 are established.

Figure 10:
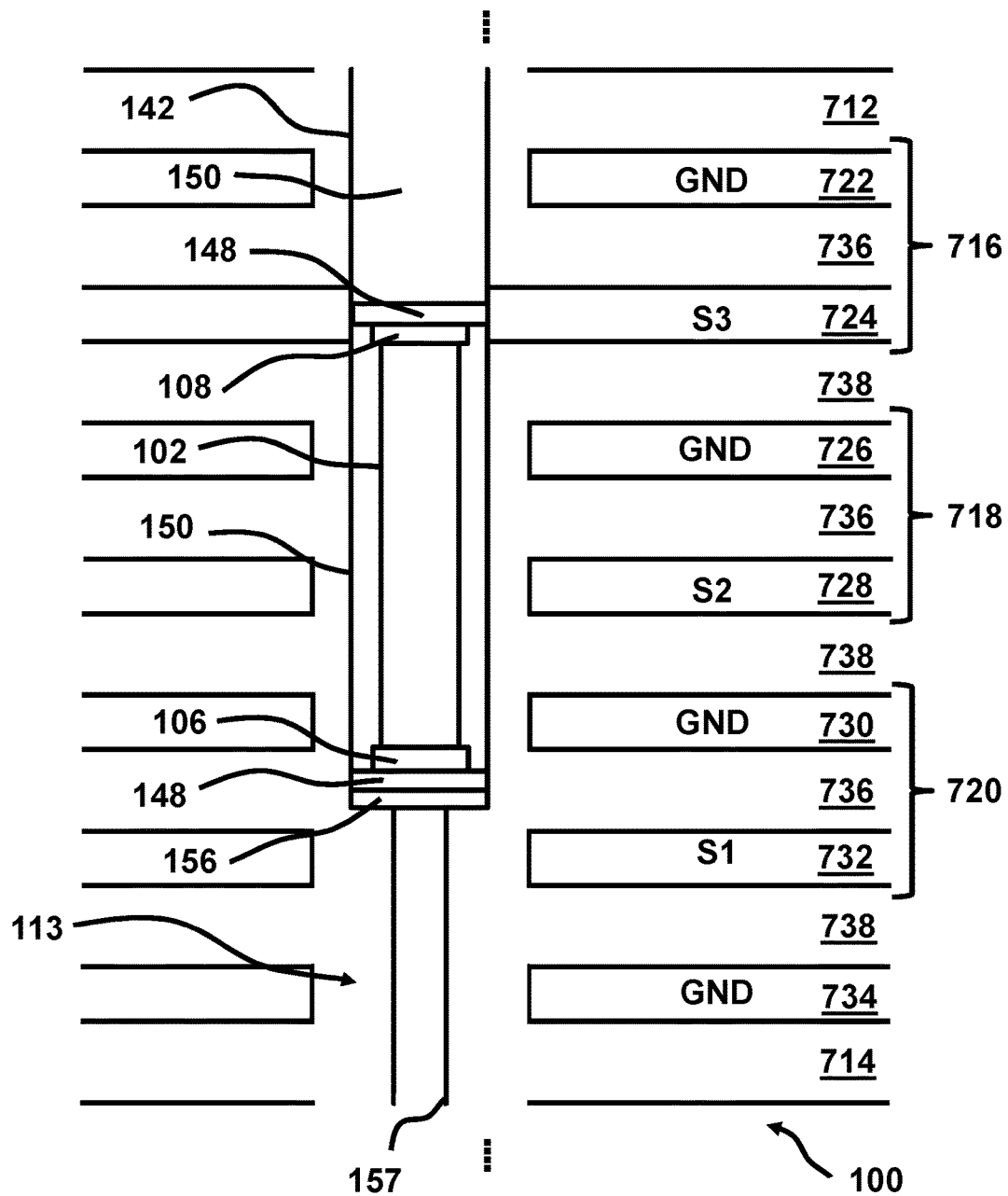
FIG. 10 depicts a schematic of a partial cross-section through the fourth exemplary PCB of FIG. 9 after embedding of a discrete electrical device, in accordance with one or more aspects of the present invention.

FIG. 10 shows the printed circuit board 100 of FIG. 9 into which an electrical device 102 has been inserted. The via 142 has been drilled into the plated through hole 157 from the backside of the PCB to the non-conductive layer 736. The unexpanded remaining end of the plated through hole 157 in the non-conductive core layer 736 at the end the drilled via 142 is the first electrically conductive structure. At the lower end of the via 142 drilled into the plated through hole 157 an electrically conductive barrier 156 is placed providing a closed bottom of the respective via 142 such that an electrically conductive connection with the plated through hole 157 is established. The second electrical contact 108 is electrically conductive connected with the signal layer 724. Thus, the electrical device 102, e.g. a capacitor, is placed in the signal path from the plated through hole 157 to the signal layer 724.

FIG. 11A to 11D show exemplary electrical devices to be embedded in a printed circuit board 100 according to the present invention. FIG. 11A shows an electrical device in form of an SMT capacitor 1100. FIG. 11B shows an electrical device in form of an SMT filter 1102. FIG. 11C shows an electrical device in form of a Z-diode 1104, i.e. an active SMT component. Finally, FIG. 11D shows an electrical device in form of a double capacitor 1106, which is intended to be inserted into the printed circuit board 100 like the electrical device 104 shown in FIGS. 3 and 6.

Figure 12:
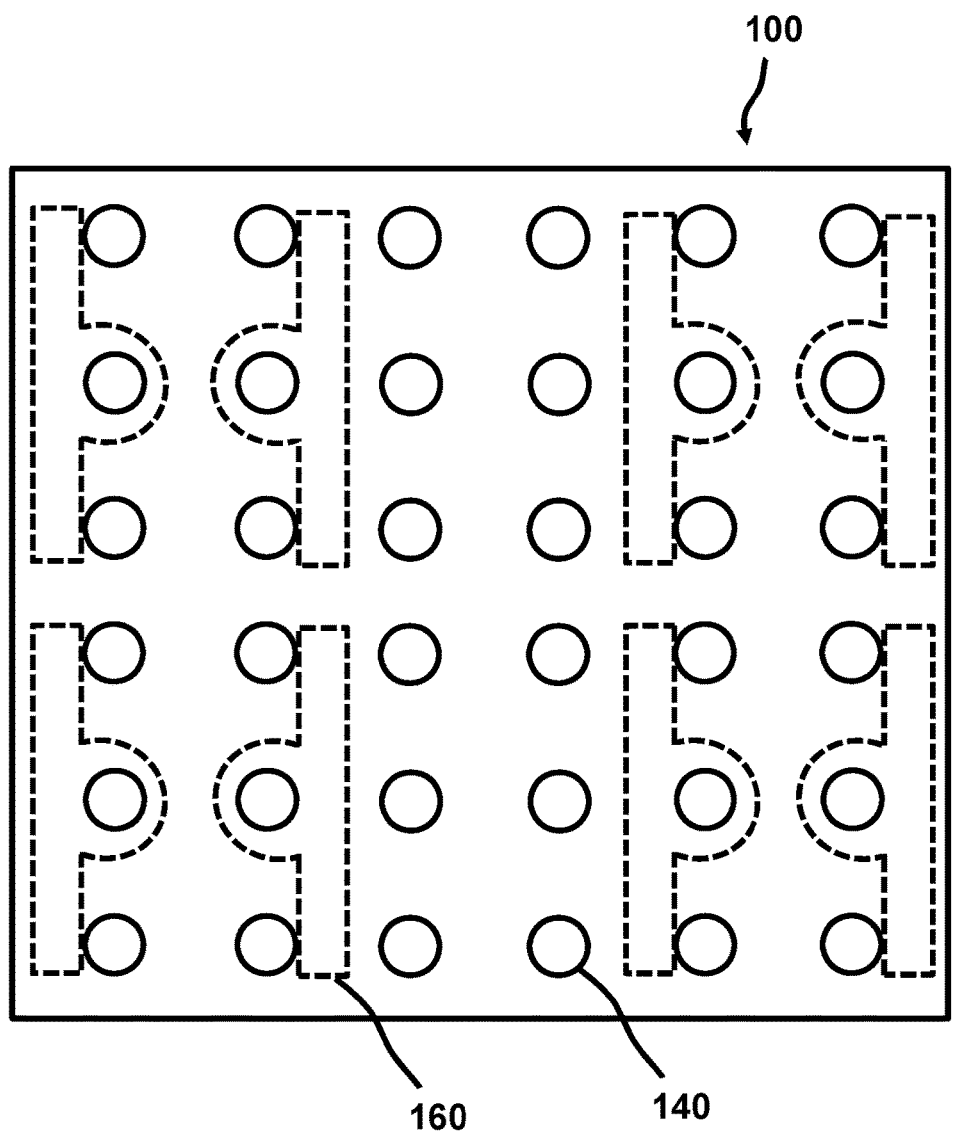
FIG. 12 depicts a schematic of a partial top view onto a PCB with embedded discrete electrical devices, in accordance with one or more aspects of the present invention.

FIG. 12 depicts a schematic of a partial top view onto the horizontal top surface 111 of a printed circuit board 100. A plurality of blind via 140 according to the present invention is drilled into the printed circuit board 100. The dashed lines indicate electrically conductive surface pads 160 on the mounting plane 111 for SMT components which may be arranged on the surface of the printed circuit board 100. Apparently the number of SMT components which are placed in the via 140, e.g. at least one in each via 140, is significantly larger than the number of SMT components which may be arranged on the top surface 111 of the printed circuit board 100.

Using known surface mount technologies for example on a 10 mm times 85 mm rectangular field of a PCB 102 surface mount components of the type 0402, like decoupling capacitors, may be arranged on the top surface, i.e. front side, and additional 102 surface mount components on the bottom surface, i.e. back side. Considering surface mount components of the type 0201, a PCB on the same field may comprise 430 components per surface on 1 mm pitch.

Embedding the electrical devices in the printed circuit board according to the present invention a significantly larger number of devices may be arranged within the same area, e.g. lager by a factor of more than two: Arranging electrically conductive surface pads 160 on the mounting plane 111 as indicated by the dashed lines in FIG. 12 may for example allow arranging one SMT component, e.g. one capacitor, per surface pads 160 on the mounting plane 111. Arranging SMT component analogously on the bottom surface may in total result in 16 capacitors arranged on the surfaces within the area of the printed circuit board 100 shown in FIG. 12. Embedding the SMT components, i.e. for example the capacitors, in the vias 140 according to the present invention, one SMT component may be arranged in each via 140 resulting in 36 embedded components within the same area of the printed circuit board 100. Embedding SMT components in the vias 140 from the top and the bottom surface of the PCB may even result in 72 embedded components within the same area.

The invention claimed is:

1. A method for embedding a discrete electrical device in a printed circuit board, the method comprising:
    providing a vertical via in the form of a blind hole from a horizontal surface of the printed circuit board to an electrically conductive structure in a first layer, the first layer being one layer of a first horizontal core section of a plurality of horizontal core sections vertically arranged above each other, each core section comprising a lower and an upper horizontal electrically conductive layer, and a horizontal electrically non-conductive core layer arranged between the lower and the upper electrically conductive layers;
    inserting the discrete electrical device into the via, the discrete electrical device being a separately formed, discrete electrical device and extending from the electrically conductive structure in the first layer along the longitudinal axis of the vertical via within at least two of the horizontal core sections;
    establishing at a first end of the discrete electrical device a first electrical connection between a first electrical contact of the discrete electrical device and the electrically conductive structure in the first layer; and
    establishing at a second end of the discrete electrical device a second electrical connection between a second electrical contact of the discrete electrical device and a second layer, the second layer being one of the lower or upper horizontal electrically conductive layers of a second horizontal core section of the plurality of horizontal core sections, and being other than the horizontal surface of the printed circuit board.

2. The method of claim 1, wherein the inserted discrete electrical device extends within at least three of the horizontal core sections.

3. The method of claim 1, further comprising establishing the first electrically conductive connection by inserting an electrically conductive paste into the vertical via underneath the discrete electrical device.

4. The method of claim 1, further comprising inserting electrically non-conductive fill material into the vertical via around the discrete electrical device from the first electrical contact up to the second electrical contact.

5. The method of claim 1, further comprising establishing the second electrically conductive connection by inserting an electrically conductive paste into the vertical via on top of the discrete electrical device.

6. The method of claim 1, further comprising inserting electrically non-conductive fill material into the vertical via from the second electrical contact up to the horizontal surface of the printed circuit board.

7. The method of claim 1, further comprising arranging a lid onto an opening of the vertical via in the horizontal surface of the printed circuit board.

8. The method of claim 1, wherein the providing the vertical via in form of the blind hole further comprises:
    providing the printed circuit board having a plated through hole extending vertically between a horizontal top surface and a horizontal bottom surface, the horizontal surface being one of the horizontal top surface or the horizontal bottom surface; and drilling the vertical via into the printed circuit board aligned to the plated through hole, thereby expanding a horizontal cross section of a vertical portion of the plated through hole by the horizontal cross section of the vertical via, the electrically conductive structure in the first layer comprising an unexpanded end of the plated through hole at an end of the drilled vertical via.

9. The method of claim 8, wherein providing the vertical via in form of the blind hole further comprises:

providing a closed bottom for the via forming the blind hole by inserting an electrically conductive barrier into the via onto the electrically conductive structure in the first layer.

10. The method of claim 1, wherein the first layer is one of the electrically conductive layers of the first horizontal core section.

11. The method of claim 10, wherein at least one of the first and second electrically conductive layers comprises a discrete electrically conductive path.

12. The method of claim 10, wherein at least one of the first and second electrically conductive layers is configured as a continuous electrically conductive layer.

13. The method of claim 10, wherein the first electrically conductive layer is the upper electrically conductive layer of the first horizontal core section and the second electrically conductive layer is the lower electrically conductive layer of the second horizontal core section.

14. The method of claim 10, wherein the first electrically conductive layer is the lower electrically conductive layer of the first horizontal core section and the second electrically conductive layer is the upper electrically conductive layer of the second horizontal core section.

15. The method of claim 10, wherein one of the first or second electrically conductive layers is grounded.

16. The method of claim 1, wherein the discrete electrical device being embedded has a third electrical contact intermediate the first end and second end of the discrete electrical device, and the method further comprises:

establishing a third electrical connection between the third electrical contact and a third electrically conductive layer of a third one of the plurality of horizontal core sections, the third horizontal core section being arranged between the first and second horizontal core sections.

17. The method of claim 16, wherein the third electrically conductive layer is grounded.

18. The method of claim 1, wherein the discrete electrical device has a cylindrical form.

19. The method of claim 1, wherein the discrete electrical device is one of a capacitor, a resistor, an inductor, a filter or an active component.

* * * * *